United States Patent
Koyama et al.

(10) Patent No.: US 9,471,182 B2
(45) Date of Patent: Oct. 18, 2016

(54) SEMICONDUCTOR DEVICE HAVING SENSOR CIRCUITS WITH AMPLIFIER CIRCUITS AND LIGHT-RECEIVING ELEMENTS

(71) Applicant: Semiconductor Energy Laboratory Co., Ltd., Atsugi-shi, Kanagawa-ken (JP)

(72) Inventors: Jun Koyama, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/827,567

(22) Filed: Aug. 17, 2015

(65) Prior Publication Data

US 2015/0355744 A1 Dec. 10, 2015

Related U.S. Application Data

(62) Division of application No. 13/898,716, filed on May 21, 2013, now Pat. No. 9,147,706.

(30) Foreign Application Priority Data

May 29, 2012 (JP) .................................. 2012-122521

(51) Int. Cl.
*H01L 27/146* (2006.01)
*G06F 3/042* (2006.01)
(Continued)

(52) U.S. Cl.
CPC ........... *G06F 3/042* (2013.01); *G02F 1/13338* (2013.01); *H01L 27/1446* (2013.01);
(Continued)

(58) Field of Classification Search
CPC ..................... H01L 27/1461; H01L 27/14641; H01L 27/14678
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Thanh V Pham
(74) *Attorney, Agent, or Firm* — Robinson Intellectual Property Law Office; Eric J. Robinson

(57) ABSTRACT

In a display portion of a liquid crystal display device, the dead space corresponding to a unit pixel is reduced while the aperture ratio of the unit pixel is increased. One amplifier circuit portion is shared by a plurality of unit pixels, so that the area of the amplifier circuit portion corresponding to the unit pixel is reduced and the aperture ratio of the unit pixel is increased. In addition, when the amplifier circuit portion is shared by a larger number of unit pixels, a photosensor circuit corresponding to the unit pixel can be prevented from increasing in area even with an increase in photosensitivity. Furthermore, an increase in the aperture ratio of the unit pixel results in a reduction in the power consumption of a backlight in a liquid crystal display device.

19 Claims, 8 Drawing Sheets

(51) Int. Cl.
*H01L 31/105* (2006.01)
*H01L 27/144* (2006.01)
*G02F 1/1333* (2006.01)

(52) U.S. Cl.
CPC ..... *H01L27/1461* (2013.01); *H01L 27/14641* (2013.01); *H01L 27/14678* (2013.01); *H01L 31/105* (2013.01)

(56) References Cited

U.S. PATENT DOCUMENTS

| | | | |
|---|---|---|---|
| 6,195,183 B1 * | 2/2001 | Fujimoto | H04N 1/486 358/512 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 6,972,753 B1 | 12/2005 | Kimura et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,430,025 B2 | 9/2008 | Okamoto et al. | |
| 7,449,718 B2 | 11/2008 | Nishi et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,679,044 B2 * | 3/2010 | Morosawa | G01J 1/32 250/214 R |
| 7,732,819 B2 | 6/2010 | Akimoto et al. | |
| 7,773,069 B2 | 8/2010 | Miyasaka et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0134735 A1 | 6/2010 | Nakamura et al. | |
| 2011/0175833 A1 | 7/2011 | Kurokawa et al. | |
| 2011/0216023 A1 | 9/2011 | Kurokawa et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-271308 A | 11/2009 |
| JP | 2011-210241 A | 10/2011 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m= 7, 8, 9, and 16) in the $In_2O_3$-$ZnGa_2O_4$-ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.
Son.K et aL, "42.4L: Late-News Paper: 4 Inch QVGA AMOLED Driven by the Threshold Voltage Controlled Amorphous GiZo ($Ga_2O_3$-$In_2O_3$-ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTs", IDW '09: Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H at al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T at al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H at al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner the area of the unit pixel is
reduced by the area of this portion

PRIOR ART

SEMICONDUCTOR DEVICE HAVING SENSOR CIRCUITS WITH AMPLIFIER CIRCUITS AND LIGHT-RECEIVING ELEMENTS

BACKGROUND OF THE INVENTION

1. Field of the Invention

The present invention relates to a semiconductor device, in particular, a semiconductor device using a non-single-crystal semiconductor layer in a light-receiving element.

In this specification, a semiconductor device refers to a device which can function by utilizing semiconductor characteristics, and an electro-optical device, a semiconductor circuit, and an electronic device are all included in the category of the semiconductor device.

2. Description of the Related Art

Various kinds of optical touch sensors have been recently proposed; in the optical touch sensor, a photosensor circuit is incorporated into a display portion of a display device. In general, one photosensor circuit is provided for a unit pixel or three subpixels (RGB). The photosensor circuit includes a light-receiving portion consisting of a light-receiving element and the like, and an amplifier circuit portion which amplifies a signal received from the light-receiving element and outputs a detected signal.

In the case where a photosensor circuit 11 is formed using a limited number of masks, that is, in the case where the photosensor circuit 11 is formed on the same plane as an amplifier circuit portion 12, the amplifier circuit portion 12 occupies a smaller area in the photosensor circuit 11 than a light-receiving portion 13. Thus, the difference in area causes a dead space 14 in a display portion as illustrated in FIG. 8A.

When the area of the light-receiving portion 13 is increased in order to increase the photosensitivity of the photosensor circuit 11, an increase in the area of the photosensor circuit 11 in the display portion further proceeds.

In Patent Document 1, the area of a unit pixel 15 is reduced by half of the area of the dead space 14 in order to remove the dead space 14 caused by a difference in the area between the amplifier circuit portion 12 and the light-receiving portion 13 in the photosensor circuit 11 (see FIG. 8B).

In Patent Document 2, a photodiode is used for a semiconductor layer in a light-receiving element. The photodiode has a stacked structure of a p-layer of microcrystalline silicon, an i-layer of amorphous silicon, and an n-layer of microcrystalline silicon.

REFERENCE

Patent Document

[Patent Document 1] Japanese Published Patent Application No. 2009-271308
[Patent Document 2] Japanese Published Patent Application No. 2011-210241

SUMMARY OF THE INVENTION

In the case where a photosensor circuit is incorporated into a display portion in a simplified process with as small number of masks as possible, the influence of a difference in the area between an amplifier circuit portion and a light-receiving portion cannot be ignored because it is difficult to stack the amplifier circuit portion and the light-receiving portion. With an increase in the difference in the area between the amplifier circuit portion and the light-receiving portion in the photosensor circuit, the dead space increases in a display portion and the area of the photosensor circuit corresponding to a unit pixel increases.

When the area of the unit pixel is reduced so as to remove the dead space as disclosed in Patent Document 1, the aperture ratio decreases.

It is very difficult to reduce the area of a photosensor circuit corresponding to a unit pixel while the aperture ratio is increased.

In the case where a photodiode is used for a light-receiving element, the three layers of an i-layer, a p-layer, and an n-layer need to be fabricated, which leads to an increase in the number of steps and thus causes an increase in manufacturing cost.

In view of the above problems, an object of one embodiment of the present invention is to reduce the dead space corresponding to a unit pixel while the aperture ratio of the unit pixel is increased.

Another object of one embodiment of the present invention is to reduce power consumption.

A further object of one embodiment of the present invention is to prevent an increase in manufacturing cost.

One amplifier circuit portion is shared by a plurality of unit pixels, whereby the area of the amplifier circuit portion corresponding to a unit pixel is reduced in a simplified process. Further, in the case where the area of a light-receiving portion is increased in order to increase the photosensitivity, the amplifier circuit portion is shared by a larger number of unit pixels so as to prevent an increase in the area of a photosensor circuit corresponding to a unit pixel.

One embodiment of the present invention disclosed in this specification is a semiconductor device including a plurality of pixels each including a liquid crystal element; an amplifier circuit including a first transistor and a second transistor; a plurality of light-receiving elements each including a non-single-crystal semiconductor layer; and a third transistor provided for each of the light-receiving elements. One terminal of the first transistor and a gate terminal of the second transistor are electrically connected to a node. One terminal of each third transistor is electrically connected to the node. The one amplifier circuit is provided for 4 to 20 pixels inclusive.

In the above, the non-single-crystal semiconductor layer is preferably an amorphous silicon layer. In particular, it is preferable to use an amorphous silicon layer in which the amount of photocurrent generated when light is received is more than or equal to 100 times as large as that of dark current.

In the above, an oxide semiconductor material may be used for semiconductor layers of the transistors.

In the above, the amplifier circuit may include a fourth transistor one terminal of which is electrically connected to one terminal of the second transistor and the other terminal of which is electrically connected to an output signal line.

In the above, each of the pixels may include not only the liquid crystal element but also a fifth transistor and a storage capacitor which are formed over the same substrate as the first to fourth transistors.

In the above, the semiconductor device may include a transmissive liquid crystal display area.

In the above, the semiconductor device may include a reflective liquid crystal display area.

Note that the position, size, range, or the like of each structure illustrated in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

When one amplifier circuit portion is shared by a plurality of unit pixels, the area of the amplifier circuit portion corresponding to the unit pixel can be reduced and the aperture ratio of the unit pixel can be increased. In addition, when the amplifier circuit portion is shared by a larger number of unit pixels, the photosensor circuit corresponding to the unit pixel can be prevented from increasing in area even with an increase in photosensitivity. Furthermore, an increase in the aperture ratio of the unit pixel results in a reduction in the power consumption of a backlight in a liquid crystal display device.

DETAILED DESCRIPTION OF THE INVENTION

Figure 1:
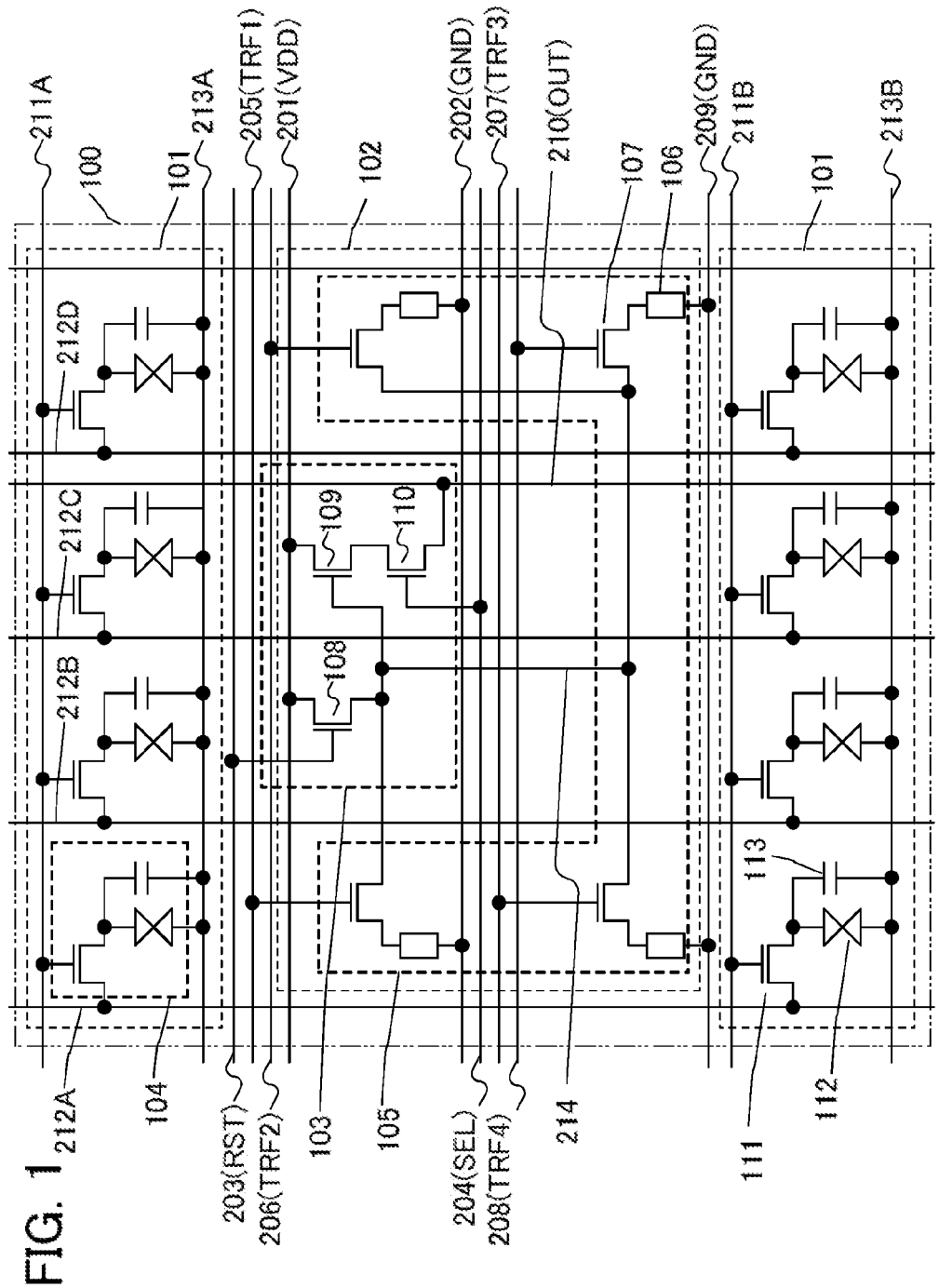
FIG. 1 is a diagram illustrating a semiconductor device according to Embodiment 1.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description of the embodiments below. Note that in the structures of the invention described below, the same portions or portions having similar functions are denoted by the same reference numerals in different drawings, and description of such portions is not repeated.

Embodiment 1

Described in this embodiment is a semiconductor device in which one amplifier circuit portion is shared by a plurality of unit pixels so as to reduce the area of a photosensor circuit corresponding to the unit pixel. The dead space in a display portion is reduced, resulting in an increase in the aperture ratio of the unit pixel.

FIG. 1 illustrates part of a display portion in the semiconductor device of one embodiment of the present invention. Note that FIG. 1 illustrates an example of the circuit configuration, and one embodiment of the present invention is not limited to this configuration.

A display portion 100 includes a pixel circuit 101 and a photosensor circuit 102. The pixel circuit 101 includes eight unit pixels 104. The photosensor circuit 102 includes an amplifier circuit portion 103 and a light-receiving portion 105.

Note that this embodiment shows an example in which the one amplifier circuit portion 103 is shared by the eight unit pixels 104; however, one embodiment of the present invention is not limited to this configuration. According to one embodiment of the present invention, the one amplifier circuit portion 103 can be shared by 4 to 20 unit pixels 104.

Further, although this embodiment shows an example in which the one amplifier circuit portion 103 is shared by four light-receiving elements 106, one embodiment of the present invention is not limited to this configuration. Note that the number of the light-receiving elements 106 sharing the one amplifier circuit portion 103 is preferably smaller than the number of the unit pixels 104.

The display portion 100 also includes a power source line (VDD) 201, a ground line (GND) 202, a reset signal line (RST) 203, a selection signal line (SEL) 204, a signal line (TRF1) 205, a signal line (TRF2) 206, a signal line (TRF3) 207, a signal line (TRF4) 208, a ground line (GND) 209, a photosensor output signal line (OUT) 210, scan lines 211 (211A and 211B), signal lines 212 (212A, 212B, 212C, and 212D), and ground lines 213 (213A and 213B).

A node 214 is a floating diffusion (FD) node. The one amplifier circuit portion 103 is shared by the four light-receiving elements 106 and four transfer transistors 107 via the node 214.

The light-receiving portion 105 includes the four light-receiving elements 106 and the four transfer transistors 107. Although this embodiment shows an example in which one light-receiving element is provided for one transfer transistor, one embodiment of the present invention is not limited to this configuration.

Each of the light-receiving elements 106 includes a pair of electrodes and a semiconductor layer interposed therebetween. A non-single-crystal semiconductor layer is used as the semiconductor layer. The non-single-crystal semiconductor layer serves as a resistor layer whose resistance varies when light is received. Accordingly, it is possible to detect the amount of light emitted to the non-single-crystal semiconductor layer for a certain period. A non-single-crystal silicon layer is preferably used as the non-single-crystal semiconductor layer, and more preferably, an amorphous silicon layer is used. In the amorphous silicon layer, it is preferable that the amount of photocurrent generated when light is received be more than or equal to 100 times as large as that of dark current. In particular, an i-type amorphous silicon layer is preferably used.

Each of the transfer transistors 107 functions as a transistor for varying the amount of charge accumulated in the node 214. In this embodiment, negative charge is accumulated in the node 214 when the potentials of the signal line (TRF1) 205, the signal line (TRF2) 206, the signal line (TRF3) 207, and the signal line (TRF4) 208, namely, the potentials of the gates of the transfer transistors 107 are switched from "L" to "H". The amount of negative charge accumulated in the node 214 depends on the amount of light emitted to each of the light-receiving elements 106 for a certain period.

The amplifier circuit portion 103 includes a reset transistor 108, an amplification transistor 109, and a selection transistor 110.

The reset transistor 108 functions as a transistor for resetting the potential of the node 214 (returning to a predetermined potential) at regular intervals. When the potential of a gate of the reset transistor 108 is switched from "L" to "H", the potential of the node 214 is also switched from "L" to "H".

The amplification transistor 109 functions as a transistor for amplifying a potential corresponding to the charge accumulated in the node 214.

The selection transistor 110 functions as a transistor for controlling output of the photosensor circuit 102. The potential amplified by the amplification transistor 109 is converted into an output signal, and then the signal is output to the photosensor output signal line (OUT) 210. The output signal is read out when the potential of the photosensor output signal line (OUT) 210 is switched from "L" to "H".

Each of the unit pixels 104 includes a transistor 111, a liquid crystal element 112, and a storage capacitor 113.

The transistor 111 has a function of controlling the injection or extraction of charge to/from the storage capacitor 113.

The storage capacitor 113 has a function of holding the charge corresponding to a voltage applied to the liquid crystal element 112. When voltage is applied to the liquid crystal element 112, the polarization direction changes. The contrast (gray scale) of light passing through the liquid crystal element 112 is made by utilizing the change in polarization direction, so that the liquid crystal element 112 is able to function as a display element. External light (sunlight or illumination light) which enters from a surface of the semiconductor device is used as the light passing through the liquid crystal element 112.

The liquid crystal element 112 includes a pair of terminals and a liquid crystal layer therebetween. There is no particular limitation on the liquid crystal layer of the liquid crystal element 112, and a known liquid crystal material (typically, a nematic liquid crystal material or a cholesteric liquid crystal material) may be used. For example, polymer dispersed liquid crystal (PDLC) or polymer network liquid crystal (PNLC) may be used for the liquid crystal layer so that a white image (a bright image) is displayed using light scattered by liquid crystal. When PDLC or PNLC is used for the liquid crystal layer, a polarizing plate is not needed and display close to paper can be achieved. Thus, an eye-friendly liquid crystal display device which causes less eye strain can be manufactured.

Note that an oxide semiconductor layer may be used for the aforementioned transistors. In order that charge generated when the light-receiving element 106 is irradiated with light is held for a long time, a transistor with extremely low off-state current is preferably used as the transfer transistor 107 electrically connected to the light-receiving element 106. The use of an oxide semiconductor material for the semiconductor layer results in an increase in the performance of the photosensor circuit 102.

One of a source and a drain of the reset transistor 108, and a gate of the amplification transistor 109 are electrically connected to the node 214. One of a source and a drain of the selection transistor 110 is electrically connected to one of a source and a drain of the amplification transistor 109. The other of the source and the drain of the amplification transistor 109 is electrically connected to the power source line (VDD) 201. The other of the source and the drain of the selection transistor 110 is electrically connected to the photosensor output signal line (OUT) 210.

The other of the source and the drain of the reset transistor 108 is electrically connected to the power source line (VDD) 201. The gate of the reset transistor 108 is electrically connected to the reset signal line (RST) 203. A gate of the selection transistor 110 is electrically connected to the selection signal line (SEL) 204.

One of a source and a drain of each of the four transfer transistors 107 is electrically connected to the node 214. The other of the source and the drain of each of the four transfer transistors 107 is electrically connected to one electrode of the respective four light-receiving elements 106. The other electrode of each of the four light-receiving elements 106 is electrically connected to the ground line (GND) 202 or 209.

Respective gates of the four transfer transistors 107 are electrically connected to the signal line (TRF1) 205, the signal line (TRF2) 206, the signal line (TRF3) 207, and the signal line (TRF4) 208.

A gate of the transistor 111 is electrically connected to a display element driver circuit (not illustrated) through the scan line 211. One of a source and a drain of the transistor 111 is electrically connected to a display element driver circuit (not illustrated) through the signal line 212. The other of the source and the drain of the transistor 111 is electrically connected to one terminal of the storage capacitor 113 and one terminal of the liquid crystal element 112. The other terminal of the storage capacitor 113 and the other terminal of the liquid crystal element 112 are electrically connected to the ground line 213 and kept at a constant potential.

The potential "H" input to the power source line (VDD) 201 is denoted as a high level power source potential VDD. The potential "L" input to the ground lines (GND) 202 and 209 is denoted as a low level power source potential VSS. In this specification, the low level power source potential VSS is a ground potential GND (0 V); however, one embodiment of the present invention is not limited to this. Any value lower than the high level power source potential VDD may be used as the low level power source potential VSS.

Figure 3:
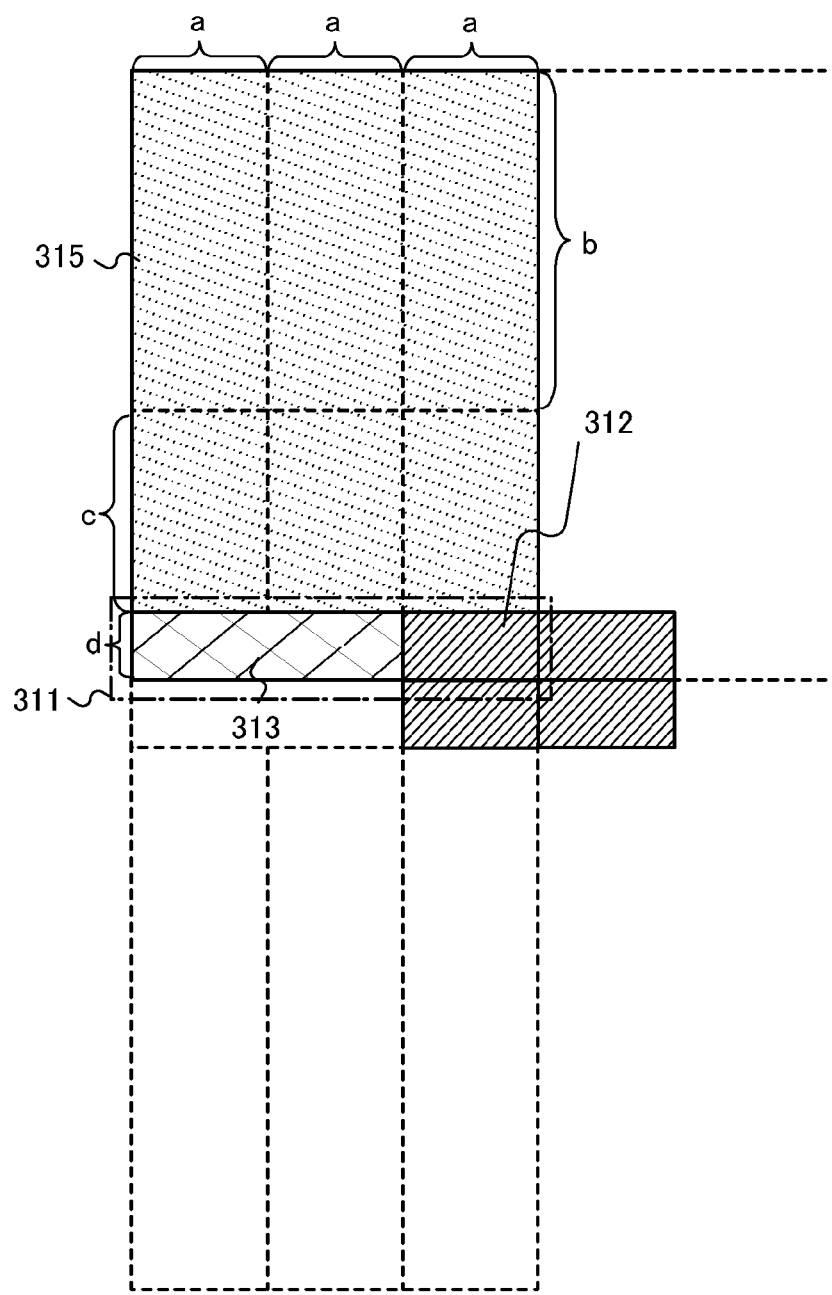
FIG. 3 is a diagram illustrating a semiconductor device according to one embodiment of the present invention.
Figure 8A:
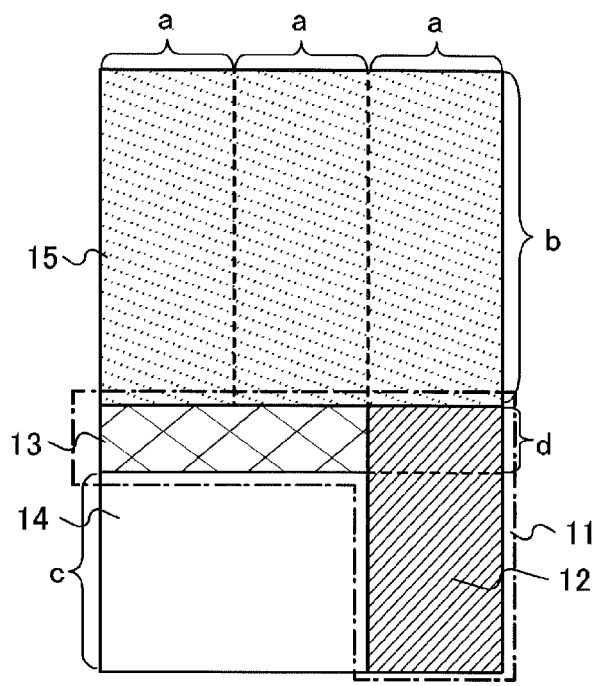
FIGS. 8A and 8B are diagrams illustrating conventional semiconductor devices.
Figure 8B:
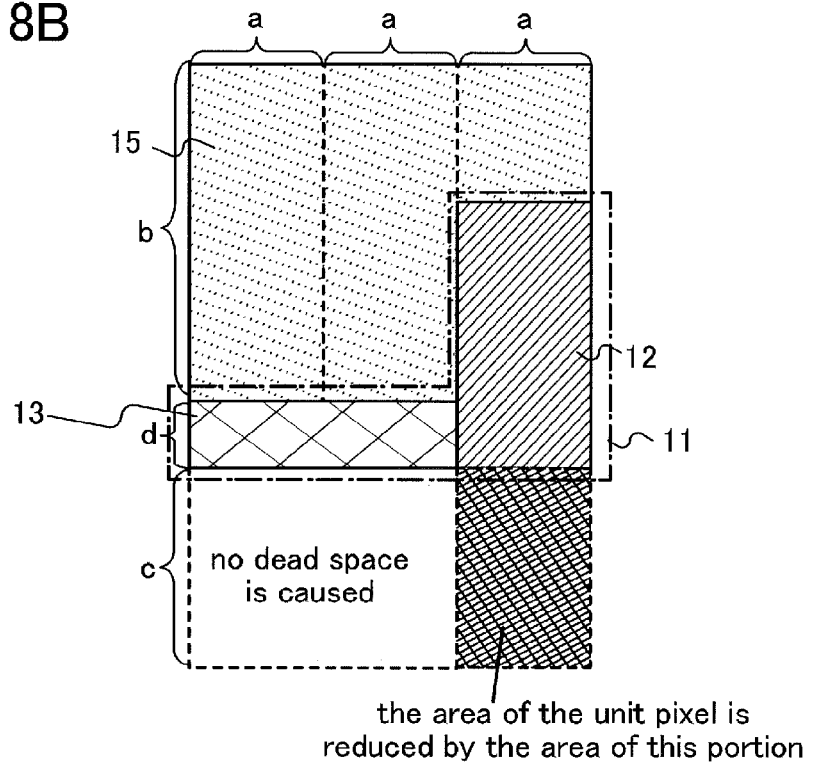

FIG. 3 is a schematic diagram of a unit pixel 315, a photosensor circuit 311, a light-receiving portion 313, and an amplifier circuit portion 312. FIG. 3 and FIGS. 8A and 8B all have the same area for comparison: the long side is (b+c+d), and the short side is 3a.

FIG. 8A includes the dead space 14 with an area of 2a×c. The dead space is removed in FIG. 8B; therefore, the area of the unit pixel 15 is reduced by a×c. The unit pixel 315 in FIG. 3 has an area of 3a×(b+c), the unit pixel 15 in FIG. 8A has an area of 3a×b, and the unit pixel 15 in FIG. 8B has an area of 2a×b+{a×(b−c)}; thus, it is found that the area of the unit pixel in FIG. 3 is larger than that in FIG. 8B.

In FIG. 8B, the area of the amplifier circuit portion 12 corresponding to the unit pixel 15 is a×(b+c). On the other hand, in FIG. 3, the one amplifier circuit portion 312 is shared by one pixel and adjacent three pixels, namely, four pixels in total; accordingly, the area of the amplifier circuit portion 312 corresponding to the pixel is ¼{a×(b+c)}.

According to one embodiment of the present invention, one amplifier circuit portion is shared by a plurality of unit pixels; thus, unlike in FIG. 8A, the area of the dead space 14 is not increased in the display portion, and unlike in FIG. 8B, the area of the unit pixel 15 is not reduced, whereby the area of the amplifier circuit portion corresponding to the unit pixel can be reduced and the aperture ratio of the unit pixel can be increased. In addition, even with an increase in the area of the light-receiving portion, the photosensor circuit corresponding to the unit pixel can be prevented from increasing in area when the amplifier circuit portion is shared by a larger number of unit pixels. Hence, even in the case of using a light-receiving element which includes a non-single-crystal semiconductor layer as a resistor layer and which might occupy a larger area in the photosensor circuit than a light-receiving element which includes stacked semiconductor layers of a p-layer, an i-layer, an n-layer, the photosensitivity of the light-receiving element can be improved without any problem. In other words, the dead space for the unit pixel can be reduced in a simplified process.

Figure 2:
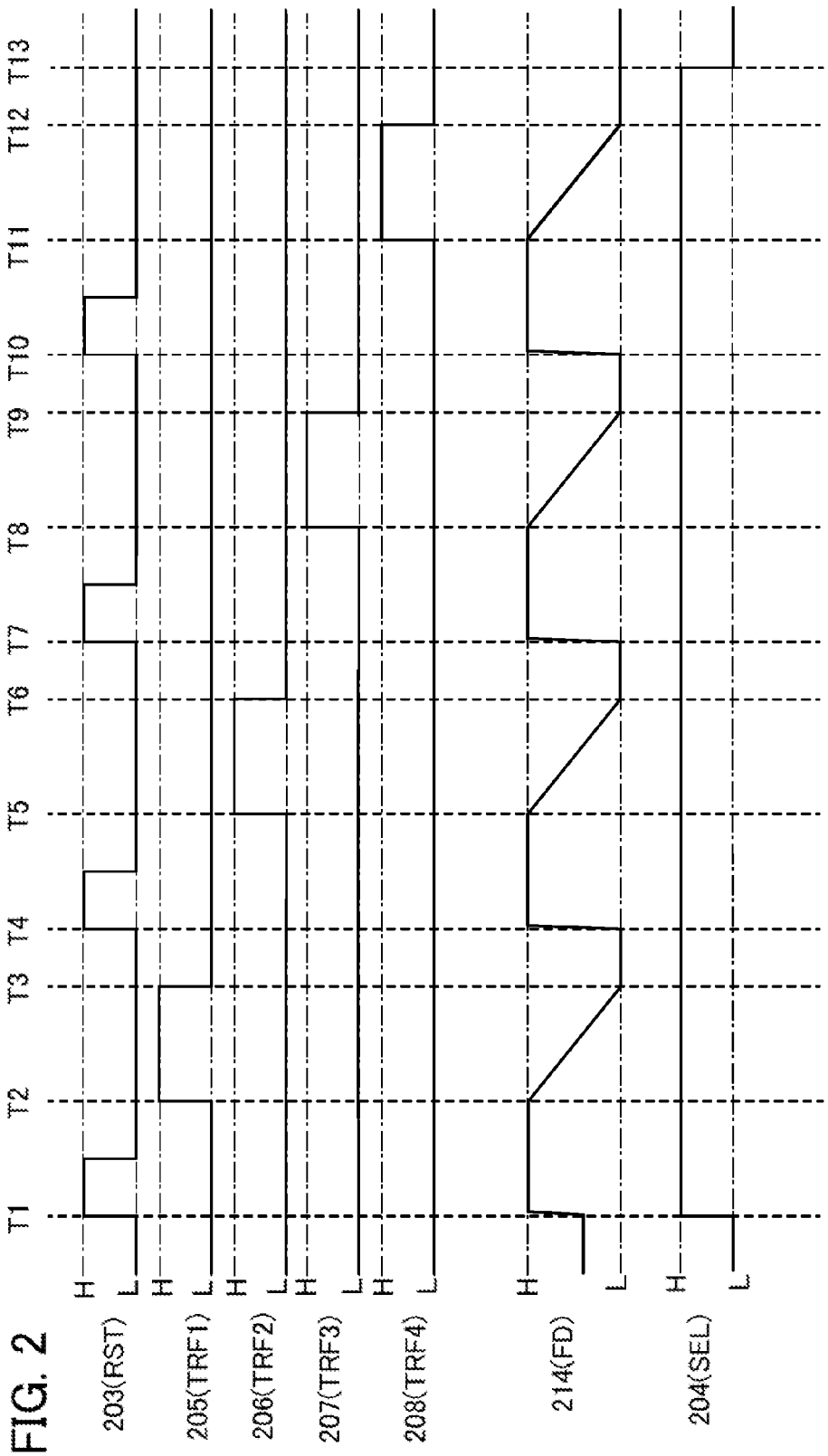
FIG. 2 is a timing chart showing the driving of a photosensor circuit according to Embodiment 1.

Next, the driving of the photosensor circuit 102 illustrated in FIG. 1 will be described. FIG. 2 is a timing chart of the photosensor circuit 102.

Note that in the timing chart of FIG. 2, the high level power source potential VDD and the low level power source potential VSS are denoted as "H" and "L", respectively.

At the time T1, the potential of the reset signal line (RST) 203 is set to "H" (first reset). Then, the gate of the reset transistor 108 has a potential of "H" and the reset transistor 108 is turned on accordingly. At this time, the potential of the node 214 is switched from "L" to "H". After a certain period, the potential of the reset signal line (RST) 203 is changed from "H" to "L".

At the time T2, the potential of the signal line (TRF1) 205 is set to "H". At this time, the gate of the transfer transistor 107 electrically connected to the signal line (TRF1) 205 has a potential of "H"; thus, the transfer transistor 107 is turned on. The light-receiving element 106 electrically connected to the transfer transistor is brought into conduction with the node 214, so that the potential of the node 214 starts to be decreased from "H".

At the time T3, the potential of the signal line (TRF1) 205 is changed from "H" to "L". At this time, the transfer transistor 107 is turned off. The potential of the node 214 is kept constant after the time T3 until the gate of the reset transistor 108 has a potential of "H" again. In this embodiment, the node 214 has the low level power source potential VSS in this period.

During the period from the time T2 to the time T3, the resistance of the light-receiving element 106 varies depending on the amount of light emitted to the light-receiving element 106, so that current flows between the light-receiving element 106 and the node 214. Charge corresponding to the current flowing is accumulated in the node 214 via the transistor 107.

At the time T4, the potential of the reset signal line (RST) 203 is set to "H" again (second reset). Then, the gate of the reset transistor 108 has a potential of "H" and the reset transistor 108 is turned on accordingly. At this time, the potential of the node 214 is switched from "L" to "H". After a certain period, the potential of the reset signal line (RST) 203 is changed from "H" to "L".

At the time T5, the potential of the signal line (TRF2) 206 is set to "H". At this time, the gate of the transfer transistor 107 electrically connected to the signal line (TRF2) 206 has a potential of "H"; thus, the transfer transistor 107 is turned on. The light-receiving element 106 electrically connected to the transfer transistor is brought into conduction with the node 214, so that the potential of the node 214 starts to be decreased from "H".

At the time T6, the potential of the signal line (TRF2) 206 is changed from "H" to "L". At this time, the transfer transistor 107 is turned off. The potential of the node 214 is kept constant after the time T6 until the gate of the reset transistor 108 has a potential of "H" again. In this embodiment, the node 214 has the low level power source potential VSS in this period.

During the period from the time T5 to the time T6, the resistance of the light-receiving element 106 varies depending on the amount of light emitted to the light-receiving element 106, so that current flows between the light-receiving element 106 and the node 214. Charge corresponding to the current flowing is accumulated in the node 214 via the transistor 107.

At the time T7, the potential of the reset signal line (RST) 203 is set to "H" again (third reset). Then, the gate of the reset transistor 108 has a potential of "H" and the reset transistor 108 is turned on accordingly. At this time, the potential of the node 214 is switched from "L" to "H". After a certain period, the potential of the reset signal line (RST) 203 is changed from "H" to "L".

At the time T8, the potential of the signal line (TRF3) 207 is set to "H". At this time, the gate of the transfer transistor 107 electrically connected to the signal line (TRF3) 207 has a potential of "H"; thus, the transfer transistor 107 is turned on. The light-receiving element 106 electrically connected to the transfer transistor is brought into conduction with the node 214, so that the potential of the node 214 starts to be decreased from "H".

At the time T9, the potential of the signal line (TRF3) 207 is changed from "H" to "L". At this time, the transfer transistor 107 is turned off. The potential of the node 214 is kept constant after the time T9 until the gate of the reset transistor 108 has a potential of "H" again. In this embodiment, the node 214 has the low level power source potential VSS in this period.

During the period from the time T8 to the time T9, the resistance of the light-receiving element 106 varies depending on the amount of light emitted to the light-receiving element 106, so that current flows between the light-receiving element 106 and the node 214. Charge corresponding to the current flowing is accumulated in the node 214 via the transistor 107.

At the time T10, the potential of the reset signal line (RST) 203 is set to "H" again (fourth reset). Then, the gate of the reset transistor 108 has a potential of "H" and the reset transistor 108 is turned on accordingly. At this time, the potential of the node 214 is switched from "L" to "H". After a certain period, the potential of the reset signal line (RST) 203 is changed from "H" to "L".

At the time T11, the potential of the signal line (TRF4) 208 is set to "H". At this time, the gate of the transfer transistor 107 electrically connected to the signal line (TRF4) 208 has a potential of "H"; thus, the transfer transistor 107 is turned on. The light-receiving element 106 electrically connected to the transfer transistor is brought into conduction with the node 214, so that the potential of the node 214 starts to be decreased from "H".

At the time T12, the potential of the signal line (TRF4) 208 is changed from "H" to "L". At this time, the transfer transistor 107 is turned off. The potential of the node 214 is kept constant after the time T12 until the gate of the reset transistor 108 has a potential of "H" again. In this embodiment, the node 214 has the low level power source potential VSS in this period.

During the period from the time T11 to the time T12, the resistance of the light-receiving element 106 varies depending on the amount of light emitted to the light-receiving element 106, so that current flows between the light-receiving element 106 and the node 214. Charge corresponding to the current flowing is accumulated in the node 214 via the transistor 107.

Further, at the time T1, the potential of the selection signal line (SEL) 204 is changed from "L" to "H" and kept at "H" during the period from the time T1 to the time T13. At the time T13, the potential of the selection signal line (SEL) 204 is changed from "H" to "L". Thus, the selection transistor 110 is kept in the on state during the period from the time T1 to the time T13. As a result, a signal is output from the photosensor output signal line (OUT) 210 as needed in accordance with the potential of the gate of the amplification transistor 109, namely, the potential of the node 214.

According to the above driving method, even in the case where each of one reset transistor, one amplification transistor, and one selection transistor is shared by the four light-receiving elements, signals corresponding to the respective four light-receiving elements can be output from the photosensor output signal line (OUT) 210 in sequence.

This embodiment can be combined with any of the other embodiments in this specification.

Embodiment 2

Described in this embodiment is a case where the semiconductor device of one embodiment of the present invention includes a reflective liquid crystal display area.

Figure 4:
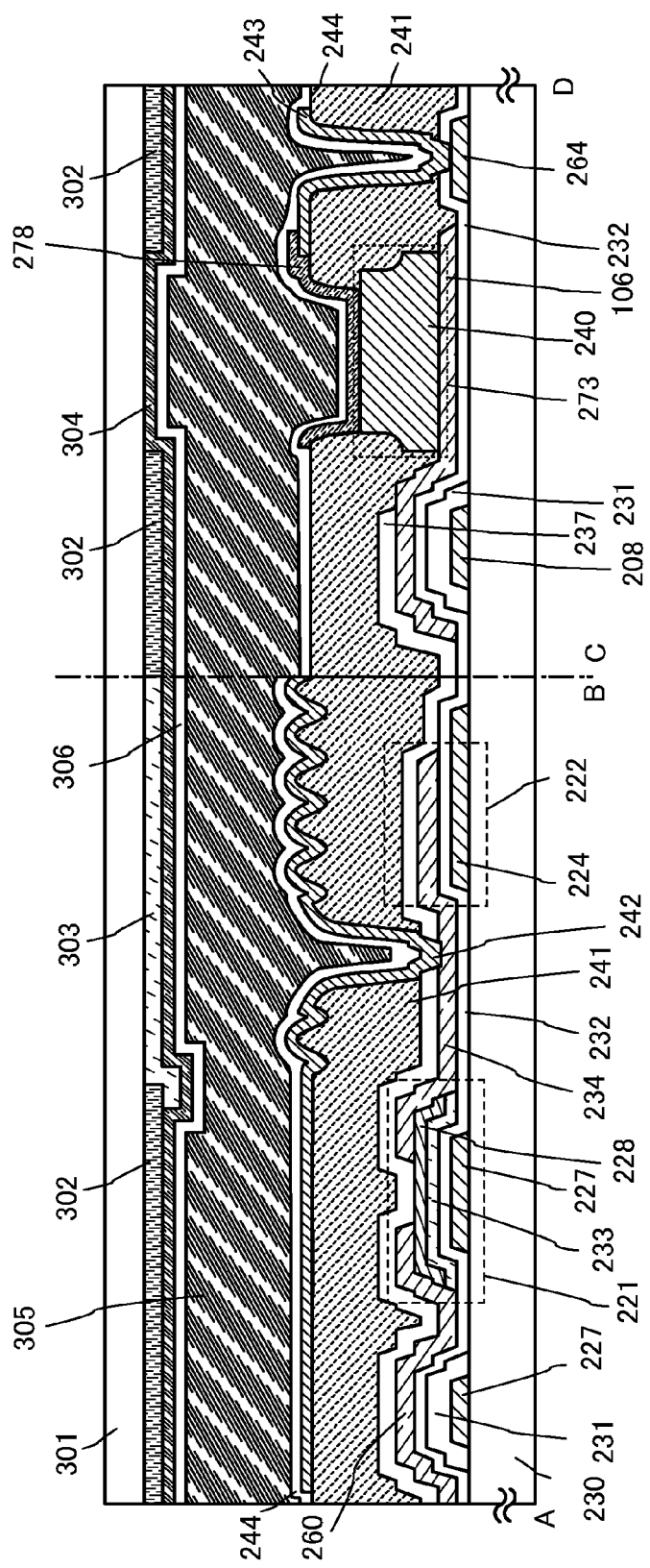
FIG. 4 is a cross-sectional view of a semiconductor device according to one embodiment of the present invention.

An example of a method for manufacturing a reflective liquid crystal display device, which includes a non-single-crystal semiconductor layer in a light-receiving element and an oxide semiconductor layer in a transistor, will be described with reference to FIG. 4. An area from A to B in FIG. 4 is part of a unit pixel, and an area from C to D is part of a photosensor circuit. Note that the structure of the unit pixel and the photosensor circuit is not limited to this.

First, a conductive film is formed over a substrate 230, and then, a scan line 227, a capacitor wiring 224, a signal line 208, and a power source line 264 are formed using the conductive film. Although not illustrated, a selection line, an electrode line, a reset line, a ground line, and the like are also formed. In this embodiment, a glass substrate is used as the substrate 230. A transistor using an oxide semiconductor layer can be fabricated at a temperature as low as 400° C. or lower; thus, a plastic substrate may also be used as the substrate 230 instead of the glass substrate.

An insulating film serving as a base film may be provided between the substrate 230 and the conductive film. The base film has a function of preventing diffusion of impurity elements from the substrate 230, and can be formed with a single layer or stacked layers of a silicon nitride film, a silicon oxide film, a silicon nitride oxide film, or a silicon oxynitride film.

The conductive film can be formed with a single layer or stacked layers including a metal material such as molybdenum, titanium, tantalum, tungsten, aluminum, copper, neodymium, or scandium, or an alloy material which contains any of these metal materials as its main component.

Then, an insulating layer is formed to cover these wirings, and selective etching is performed such that an insulating layer 231 remains only in portions intersecting wirings which are to be formed later. In this embodiment, a silicon oxynitride film with a thickness of 600 nm is used as the insulating layer 231.

Next, a gate insulating layer 232 and an oxide semiconductor film are formed.

The gate insulating layer 232 may be formed using a silicon film containing nitrogen. The silicon film containing nitrogen has higher relative permittivity than a silicon oxide film and needs to have a larger thickness than the silicon oxide film to obtain the same electrostatic capacity; thus, it is possible to physically increase the thickness of the gate insulating layer. Accordingly, a reduction in withstand voltage of the transistor is prevented and further the withstand voltage is improved, whereby electrostatic breakdown of the semiconductor device can be prevented.

The thickness of the gate insulating layer 232 is made larger than at least that of an oxide insulating layer described later, and preferably has a thickness of 325 nm to 550 nm, more preferably a thickness of 355 nm to 550 nm.

As the silicon film containing nitrogen, for example, a silicon nitride film, a silicon nitride oxide film, or a silicon oxynitride film can be used; in particular, a silicon nitride film is preferably used because a film containing a larger amount of nitrogen has a higher relative permittivity. Further, the energy gap of silicon nitride is as small as 5.5 eV whereas the energy gap of silicon oxide is 8 eV, and the specific resistance of silicon nitride is small accordingly; therefore, the use of a silicon nitride film can lead to high electrostatic discharge (ESD) resistance. In addition, in the case where a silicon nitride film is formed by a CVD method, it is not necessary to use an $N_2O$ gas that is a greenhouse gas and is used when a silicon film containing oxygen and nitrogen such as a silicon nitride oxide film is formed by a CVD method. Note that in this specification, a silicon oxynitride film refers to a film that includes more oxygen than nitrogen, and a silicon nitride oxide film refers to a film that includes more nitrogen than oxygen.

As the oxide semiconductor film, an oxide thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. Further, $SiO_2$ may be contained in the above oxide thin film.

As the target for forming the oxide thin film by a sputtering method, for example, an oxide target having a composition of $In_2O_3:Ga_2O_3:ZnO=1:1:1$ [molar ratio] is used to form an In—Ga—Zn—O film. Without limitation to the material and composition of this target, for example, an oxide target having a composition of $In_2O_3:Ga_2O_3:ZnO=1:1:2$ [molar ratio] may be used. Note that here, for example, an In—Ga—Zn—O film refers to an oxide film containing indium (In), gallium (Ga), and zinc (Zn), and there is no particular limitation on the stoichiometric proportion.

Note that an oxide insulating layer may be provided between the gate insulating layer 232 and the oxide semiconductor film.

The oxide insulating layer includes one or more metal elements selected from the constituent elements of the oxide semiconductor film. By forming the oxide insulating layer using such a material, it is possible to stabilize the interface between the oxide insulating layer and the oxide semiconductor film and reduce charge trapping at the interface. As a result, it is possible to prevent degradation of a transistor, particularly photodegradation, and thus obtain a highly reliable transistor.

Specifically, the oxide insulating layer is preferably a gallium oxide film (also referred to as $GaO_x$ (note that x is not necessarily a natural number and may be a non-natural number)), a gallium zinc oxide film (also referred to as $Ga_2Zn_xO_y$ (x=1 to 5)), a $Ga_2O_3(Gd_2O_3)$ film, or an In—Ga—Zn-based oxide film with a high gallium content and a low indium content, for example.

The oxide insulating layer and the oxide semiconductor film may have different compositions of the same constituent elements. For example, in the case where an In—Ga—Zn-based oxide semiconductor layer is used as the oxide semiconductor film, since the energy gap can be controlled by the ratio between indium (In) and gallium (Ga), the oxide semiconductor film may have an atomic ratio of In:Ga:Zn=1:1:1 or In:Ga:Zn=3:1:2 and the oxide insulating layer may have an atomic ratio of In:Ga:Zn=1:3:2. Note that the oxide insulating layer and the oxide semiconductor film can be formed by a sputtering method, and with a sputtering target containing indium, generation of particles during deposition can be reduced. Thus, the oxide insulating layer containing indium and the oxide semiconductor film containing indium are preferable.

Another oxide semiconductor film (second oxide semiconductor film) may be formed over the aforementioned oxide semiconductor film (first oxide semiconductor film), so that the oxide semiconductor film has a stacked structure. FIG. 4 illustrates an example in which an oxide semiconductor layer 233 is formed with the first oxide semiconductor film and an oxide semiconductor layer 228 is formed with the second oxide semiconductor film.

It is preferable that the first oxide semiconductor film and the second oxide semiconductor film have different compositions of the same constituent elements. In the case where oxide semiconductor films containing indium and gallium are formed as the first oxide semiconductor film and the second oxide semiconductor film, it is preferable that the content of indium be higher than the content of gallium (In>Ga) in the first oxide semiconductor film that is on the side closer to a gate electrode (on the channel side). It is also preferable that the content of indium be lower than or equal to the content of gallium (In≤Ga) in the second oxide semiconductor film that is on the side farther from the gate electrode (on the back channel side).

In an oxide semiconductor, the s orbital of heavy metal mainly contributes to carrier conduction, and when the indium content in the oxide semiconductor is increased, overlaps of the s orbitals are likely to be increased. Therefore, an oxide having a composition of In>Ga has higher mobility than an oxide having a composition of In≤Ga. Further, in Ga, the formation energy of an oxygen vacancy is larger and thus oxygen vacancies are less likely to be generated, than in In; therefore, the oxide having a composition of In≤Ga has more stable characteristics than the oxide having a composition of In>Ga.

An oxide semiconductor having a composition of In>Ga is used on the channel side, and an oxide semiconductor having a composition of In≤Ga is used on the back channel side, so that mobility and reliability of a transistor can be further improved. For example, the first oxide semiconductor film may have an atomic ratio of In:Ga:Zn=3:1:2 and the second oxide semiconductor film may have an atomic ratio of In:Ga:Zn=1:1:1.

Note that it is preferable that the oxide insulating layer in contact with the first oxide semiconductor film and the first oxide semiconductor film have different compositions of the same constituent elements so that the conductivity of the oxide insulating layer is lowered, because the interface between the two can be further stabilized. The same applies to the case where the oxide insulating layer is in contact with the second oxide semiconductor film.

Oxide semiconductors having different crystallinities may be used for the first oxide semiconductor film and the second oxide semiconductor film. That is, the first and second oxide semiconductor films may be formed using a combination of any of a single crystal oxide semiconductor, a polycrystalline oxide semiconductor, a microcrystalline oxide semiconductor, an amorphous oxide semiconductor, and a CAAC-OS film as appropriate. When an amorphous oxide semiconductor is used for at least one of the first oxide semiconductor film and the second oxide semiconductor film, internal stress or external stress of the stacked structure of the first oxide semiconductor film and the second oxide semiconductor film is relieved, a variation in characteristics among transistors is reduced, and the reliability of the transistors can be further improved.

An amorphous oxide semiconductor is likely to incorporate impurities, such as hydrogen which serves as donors, and to generate an oxygen vacancy and thus easily becomes an n-type. Therefore, the first oxide semiconductor film on the channel side is preferably formed using an oxide semiconductor having crystallinity such as a CAAC-OS film.

The oxide semiconductor is a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis. Note that in this specification and the like, an oxide semiconductor including a c-axis aligned crystal is called a c-axis aligned crystalline oxide semiconductor (CAAC-OS).

The CAAC-OS is not a single crystal, but this does not mean that the CAAC-OS is composed of only an amorphous component. Although the CAAC-OS includes a crystalline portion, a boundary between one crystalline portion and another crystalline portion is not clear in some cases.

In the case where oxygen is included in the CAAC-OS, nitrogen may be substituted for part of oxygen included in the CAAC-OS. The c-axes of individual crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

As an example of such a CAAC-OS, there is a material which is formed into a layer shape and has a triangular or hexagonal atomic arrangement when observed from the direction perpendicular to a surface of the layer or a surface of a supporting substrate, and in which metal atoms are arranged in a layered manner or metal atoms and oxygen atoms (or nitrogen atoms) are arranged in a layered manner when a cross section of the layer is observed.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping its crystal state, whereby the crystal state of the sputtering target is transferred to the substrate and the CAAC-OS film can be formed.

For the deposition of the CAAC-OS film, the following conditions are preferably used.

Reduction in the amount of impurities during the deposition can prevent the crystal state from being broken by the impurities. For example, impurities (e.g., hydrogen, water, carbon dioxide, or nitrogen) which exist in a deposition chamber may be reduced. Furthermore, impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

When an amorphous oxide semiconductor is used for the second oxide semiconductor film on the back channel side, the second oxide semiconductor film is likely to have oxygen vacancies and easily becomes n-type by etching treatment for forming a source electrode layer and a drain electrode layer which are to be formed later. It is preferable that the second oxide semiconductor film be formed using a crystalline oxide semiconductor.

In this embodiment, a silicon oxynitride film with a thickness of 100 nm is used as the gate insulating layer 232, and an In—Ga—Zn—O film with a thickness of 30 nm is used as the oxide semiconductor film.

With use of the above oxide semiconductor film (first semiconductor film), the oxide semiconductor layer 233 is formed to overlap the scan line 227 with the gate insulating layer 232 interposed therebetween.

Next, the oxide semiconductor layers are subjected to first heat treatment. This first heat treatment allows the oxide semiconductor layers to be dehydrated or dehydrogenated. The temperature of the first heat treatment is higher than or equal to 350° C. and lower than the strain point of the substrate. In this embodiment, heat treatment is performed using a rapid thermal annealing (RTA) apparatus at 650° C. for 6 minutes under a nitrogen atmosphere; the substrate is introduced to an electric furnace that is one kind of heat treatment apparatus without exposure to the air; and the oxide semiconductor layers are subjected to heat treatment at 450° C. for one hour under a nitrogen atmosphere. Then, the substrate is transferred into the deposition chamber of the oxide semiconductor layers so as not to be exposed to the air, whereby the oxide semiconductor layers are obtained without entry of water or hydrogen into the oxide semiconductor layers.

Next, a conductive film is formed over the gate insulating layer 232 and the oxide semiconductor layers. The conductive film may be, for example, a metal film containing an element selected from aluminum (Al), chromium (Cr), copper (Cu), tantalum (Ta), titanium (Ti), molybdenum (Mo), and tungsten (W) as a component, an alloy film containing a nitride of any of these elements as a component, or an alloy film combining any of these elements. In this embodiment, the conductive film has a three-layer structure of a titanium film with a thickness of 100 nm, an aluminum film with a thickness of 400 nm, and a titanium film with a thickness of 100 nm.

Then, a resist mask is formed over the conductive film and selective etching is performed, whereby a signal line 260, an electrode layer 234, and an electrode layer 273 are formed.

Note that a transistor 221 includes the oxide semiconductor layer 233, the scan line 227 as a gate, the signal line 260 as one of a source electrode layer and a drain electrode layer, and the electrode layer 234 as the other of the source electrode layer and the drain electrode layer.

Further, a storage capacitor 222 is formed by the electrode layer 234 and the capacitor wiring 224 using the gate insulating layer 232 interposed therebetween as a dielectric.

Next, second heat treatment (preferably at 200° C. to 400° C.) is performed in an inert gas atmosphere or an oxygen gas atmosphere. In this embodiment, the second heat treatment is performed at 220° C. for 1 hour in a nitrogen atmosphere. Through the second heat treatment, part of the oxide semiconductor layer (a channel formation region) is heated while being in contact with the insulating layer.

Then, an insulating layer 237 serving as a protective insulating layer is formed, and openings are formed so as to reach the electrode layer 234, the electrode layer 273, and the power supply line 264. In this embodiment, the insulating layer 237 is a silicon oxide film with a thickness of 300 nm formed by a sputtering method.

Next, a non-single-crystal semiconductor layer 240 is formed over the electrode layer 273. In this embodiment, as the non-single-crystal semiconductor layer 240, an i-type amorphous silicon layer with a thickness of 800 nm is formed by a plasma CVD method. Then, the non-single-crystal semiconductor layer 240 is selectively etched.

Next, a photosensitive organic resin layer is formed, a region to be an opening is exposed to light using a light-exposure mask, and a region to be uneven is exposed to light using another light-exposure mask and developed, so that an insulating layer 241 which is partly uneven is formed. In this embodiment, an acrylic resin with a thickness of 1.5 µm is used for the photosensitive organic resin layer.

Then, a reflective conductive film is formed, and a reflective electrode layer 242 and a connection electrode layer 243 are formed using the reflective conductive film. Further, an electrode layer 278 is formed so as to be in contact with the connection electrode layer 243 and to overlap the non-single-crystal semiconductor layer 240. The electrode layer 278 is preferably formed using a light-transmitting conductive material such as ITO so that light is transmitted to the non-single-crystal semiconductor layer 240. Note that the reflective electrode layer 242, the connection electrode layer 243, and the electrode layer 278 are illustrated in FIG. 4. For the reflective conductive film, aluminum (Al), silver (Ag), or an alloy thereof such as aluminum containing neodymium (Nd) or an Ag—Pd—Cu alloy is used. In this embodiment, the reflective conductive film has a layered structure of a 100 nm-thick titanium (Ti) film and a 300 nm-thick aluminum (Al) film over the titanium (Ti) film. Next, third heat treatment is performed at 250° C. for 1 hour in a nitrogen atmosphere in this embodiment. Then, an alignment film 244 covering the reflective electrode layer 242 is formed.

Through the above steps, a pixel including the reflective electrode layer 242 and a light-receiving element 106 including the non-single-crystal semiconductor layer 240 can be manufactured over the same substrate. The light-receiving element 106 has a structure in which the non-single-crystal semiconductor layer 240 is interposed between the pair of electrodes, i.e., the electrode layer 273 and the connection electrode layer 278.

Then, a counter substrate is prepared to be bonded to the active matrix substrate manufactured in the above manner. A light-transmitting substrate 301 is used as the counter substrate. A light-blocking layer (also referred to as black matrix) 302 is formed on the substrate 301, and a color filter 303 is formed over the reflective electrode layer 242. As the light-blocking layer 302, a metal film having low reflectivity such as a titanium film or a chromium film, an organic resin film impregnated with a black pigment or a black dye, or the like can be used. The color filter 303 is a coloring layer through which light in a specific wavelength range passes. For example, a red (R) coloring layer which transmits light in a red wavelength range, a green (G) coloring layer which transmits light in a green wavelength range, a blue (B) coloring layer which transmits light in a blue wavelength range, and the like can be used.

Neither a light-blocking layer nor a color filter is formed over the non-single-crystal semiconductor layer 240. Further, a light-transmitting conductive film 304 is formed to cover the substrate 301, the light-blocking layer 302, and the color filter 303. The light-transmitting conductive film 304 may be formed using indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, graphene, or the like. Further, a columnar spacer using an organic resin is formed. Lastly, an alignment film 306 is formed to cover them.

The counter substrate is attached to the active matrix substrate with a sealant, and a liquid crystal layer 305 is interposed between the pair of substrates. The light-blocking layer 302 of the counter substrate is provided so as not to overlap a display area of the reflective electrode layer 242 or a sensing area of the light-receiving element 106. The columnar spacer is provided on the counter substrate with accurate alignment so that the distance between the pair of substrates is kept constant.

In the above manner, it is possible to manufacture the semiconductor device illustrated in FIG. 4 in which the reflective conductive film is used as the pixel electrode.

In FIG. 4, the light-receiving element 106 has a structure in which the electrode layer 273, the non-single-crystal semiconductor layer 240, and the connection electrode layer 278 are stacked in order. That is, the pair of electrodes of the light-receiving element are over and below the non-single-crystal semiconductor layer, and in contact therewith. The structure of the light-receiving element is not limited to this, and the pair of electrodes of the light-receiving element may be formed in contact with the same surface of the non-single-crystal semiconductor layer.

This embodiment can be combined with any of the other embodiments in this specification.

Embodiment 3

Described in this embodiment is a case where the semiconductor device of one embodiment of the present invention includes a light-transmitting liquid crystal display area. Note that in this embodiment, portions which are the same as those in Embodiment 2 are denoted by the same reference numerals, and description thereof will be omitted.

Figure 5:
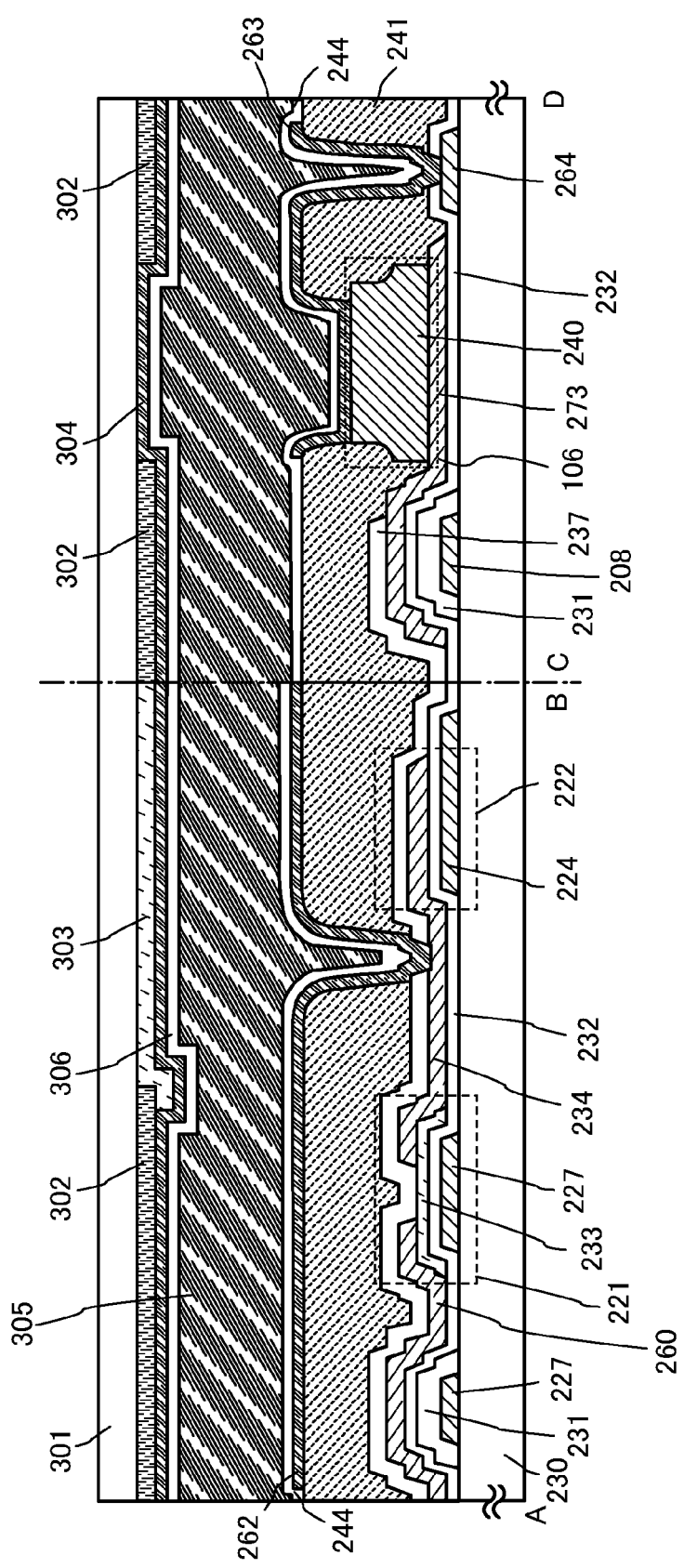
FIG. 5 is a cross-sectional view of a semiconductor device according to one embodiment of the present invention.

An example of a light-transmitting liquid crystal display device, which includes a non-single-crystal semiconductor layer in a light-receiving element and an oxide semiconductor layer in a transistor, will be described with reference to FIG. 5. An area from A to B in FIG. 5 is part of a unit pixel, and an area from C to D is part of a photosensor circuit. Note that the structure of the unit pixel and the photosensor circuit is not limited to this.

The insulating layer 241 of the semiconductor device in FIG. 5 is formed so as to have a flat surface without unevenness.

In the semiconductor device illustrated in FIG. 5, an electrode layer 262 and a connection electrode layer 263 are formed using a light-transmitting conductive film instead of the reflective electrode layer 242 and the connection electrode layer 243 in FIG. 4. Light from a backlight provided on the active matrix substrate side is reflected by a finger or the like over the light-receiving element 106, and the reflected light enters the light-receiving element 106. In this manner, sensing using a photosensor circuit can be performed.

In the above manner, it is possible to obtain the semiconductor device illustrated in FIG. 5 in which the light-transmitting conductive film is used as the pixel electrode.

Note that the pair of electrodes between which the liquid crystal layer is interposed may be formed using a light-transmitting conductive film and the pair of light-transmitting electrodes may be provided over the same substrate. As a result, it is possible to obtain a semiconductor device in which liquid crystal molecules are driven with a horizontal electric field mode such as an in-plane switching (IPS) mode.

This embodiment can be combined with any of the other embodiments in this specification.

Embodiment 4

Figure 6A:
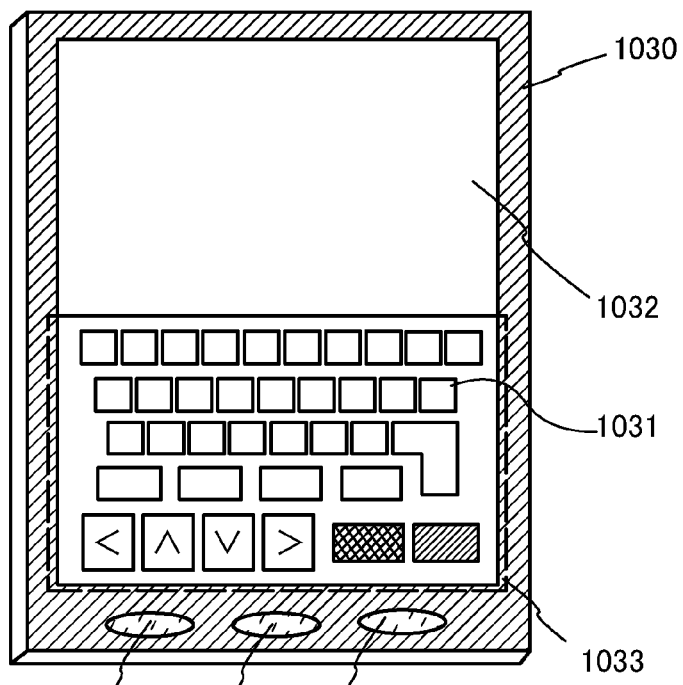
FIGS. 6A and 6B are views illustrating an example of an electric device according to one embodiment of the present invention.

In this embodiment, an example of an electric device including a display portion on which an image is displayed will be described with reference to FIGS. 6A and 6B.

An example of the structure of the electric device illustrated in FIGS. 6A and 6B will be described. A display portion 1032 in an electric device 1030 has a touch-input function using photosensors. A plurality of keyboard buttons 1031 are displayed on an area 1033 in the display portion as illustrated in FIG. 6A. The display portion 1032 indicates the entire display area and includes the area 1033 in the display portion. A user inputs data by touching desired keyboard buttons, and the result of the input is displayed on the display portion 1032.

Since a still image is displayed on the area 1033 in the display portion, power consumption can be reduced by putting a display element control circuit in a non-operation state in a period other than writing time.

An example of the usage of the electric device 1030 is described. For example, letters are input by successively touching the keyboard buttons displayed on the area 1033 in the display portion with user's fingers or without contact, and text which is displayed as a result of the input is displayed on an area other than the area 1033 in the display portion. After a set period of time in which an output signal of the photosensor is not detected since the user removes his/her fingers from the keyboard of the screen, the keyboard displayed on the area 1033 in the display portion disappears automatically and the input text is displayed also on the area 1033 in the display portion, so that the user can see the input text displayed on all the area of the screen. In the case where input is performed again, the keyboard buttons can be displayed on the area 1033 in the display portion again by touch of the display portion 1032 with the user's finger or detection of an output signal of a photosensor without contact, and input of letters can be performed.

Figure 6B:
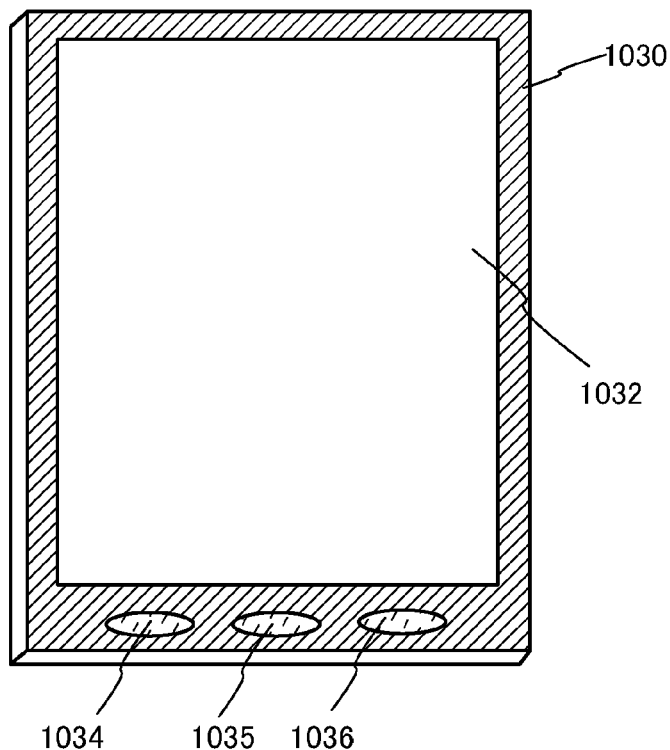

Alternatively, the displayed keyboard can be removed not automatically but by pushing a switch 1034 by the user so that a still image can be displayed on the entire display portion 1032 as illustrated in FIG. 6B. In addition, the still image can be held for a long time even when the power is turned off by pushing a power switch 1035. The keyboard can be displayed by pushing a keyboard display switch 1036 so that touch-input can be performed.

Alternatively, the switch 1034, the power switch 1035, and the keyboard display switch 1036 may each be displayed as a switch button on the display portion 1032. Each operation may be performed by touching the displayed switch button.

Further, without limitation to the structure in which a still image is displayed on the area 1033 in the display portion, a moving image may be displayed on the area 1033 in the display portion temporarily or partly. For example, a position where the keyboard buttons are displayed may be changed temporarily based on user's preference, or when input is performed without contact, only the display of a keyboard button corresponding to a letter which is input may be partly changed in order to confirm whether the input is performed.

The electric device 1030 includes at least a battery, and preferably includes a memory for storing data (e.g., a flash memory circuit, an SRAM circuit, or a DRAM circuit), a central processing unit (CPU), or a logic circuit. With a CPU or a memory, various kinds of software can be installed and thus, the electric device 1030 can have part or all of the functions of a personal computer.

In addition, when a gradient detector such as a gyroscope or a triaxial acceleration sensor is provided in the electric device 1030, a function used in the electric device 1030, in particular, a function relating to display and input on the display portion can be switched by an arithmetic circuit in response to a signal from the gradient detector. Therefore, unlike an electric device with an input key which has predetermined kind, size, or arrangement, such as a built-in operation key, the electric device 1030 can improve convenience for users.

When the circuit configuration shown in Embodiment 1 is used for the display portion of the aforementioned electric device 1030, the area of a photosensor corresponding to a unit pixel can be reduced and the aperture ratio of the unit pixel can be increased. A reduction in the area of the photosensor corresponding to the unit pixel can be realized even when the photosensitivity is increased. Moreover, the power consumption of a backlight can be reduced in the electric device 1030.

This embodiment can be combined with any of the other embodiments in this specification.

Embodiment 5

In this embodiment, a semiconductor device including a reflective liquid crystal display area, which is different from that shown in Embodiment 2, will be described with reference to FIG. 7.

A non-single-crystal semiconductor layer is used in a light-receiving element. In FIG. 4, the light-receiving element 106 has a structure in which the electrode layer 273, the non-single-crystal semiconductor layer 240, and the connection electrode layer 278 are stacked in order. That is, the pair of electrodes of the light-receiving element are over and below the non-single-crystal semiconductor layer, and in contact therewith. The structure of the light-receiving element of this embodiment is different from that in FIG. 4, and the pair of electrodes of the light-receiving element are formed in contact with the same surface of the non-single-crystal semiconductor layer.

Figure 7:
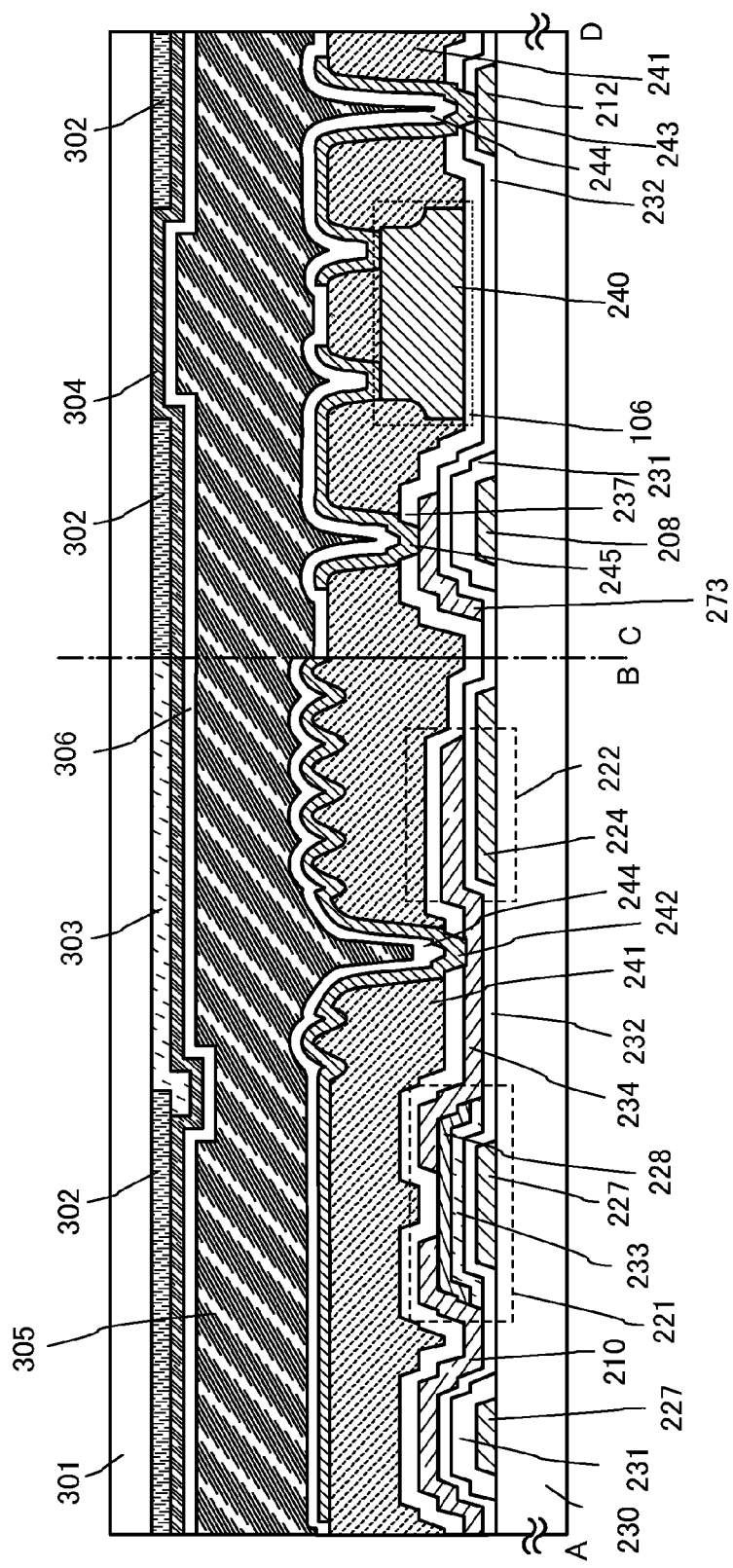
FIG. 7 is a cross-sectional view of a semiconductor device according to one embodiment of the present invention.

FIG. 7 is different from FIG. 4 only in the peripheral structure of the light-receiving element; thus, the description of the same portions is omitted here.

The pair of electrodes are provided over and below the non-single-crystal semiconductor layer 240 in Embodiment 2; in this embodiment, the pair of electrodes are provided over the non-single-crystal semiconductor layer 240.

Some steps for obtaining the cross-sectional structure illustrated in FIG. 7 will be described below.

The non-single-crystal semiconductor layer 240 is formed in steps similar to those in Embodiment 2. After the insulating layer 241 is formed to cover the non-single-crystal semiconductor layer 240, a plurality of openings are formed in the insulating layer 241 so as to reach the non-single-crystal semiconductor layer 240. Then, a conductive layer is formed and subjected to a photolithography step and an etching step, whereby the connection electrode layer 243 and a connection electrode layer 245 are formed to be in contact with the top surface of the non-single-crystal semiconductor layer 240. The connection electrode layer 245 is electrically connected to the electrode layer 273 through an opening formed in the insulating layer 237. In this manner, it is possible to manufacture the semiconductor device including the light-receiving element in which the connection electrode layer 243 and the connection electrode layer 245 are provided over the non-single-crystal semiconductor layer 240.

The number of steps and the number of masks for obtaining the cross-sectional structure illustrated in FIG. 7 are the same as those for obtaining the cross-sectional structure illustrated in FIG. 4. Note that the number of openings in the cross-sectional structure illustrated in FIG. 7 is larger than that illustrated in FIG. 4.

This embodiment can be combined with any of the other embodiments in this specification.

This application is based on Japanese Patent Application serial No. 2012-122521 filed with Japan Patent Office on May 29, 2012, the entire contents of which are hereby incorporated by reference.

What is claimed is:

1. A semiconductor device comprising:
   a plurality of pixels; and
   a plurality of sensor circuits,
   wherein each of the plurality of sensor circuits comprises an amplifier circuit and a plurality of light-receiving elements,
   wherein each of the plurality of light-receiving elements is electrically connected to the amplifier circuit via a first transistor provided for each of the light receiving elements, and
   wherein the number of the sensor circuits is less than the number of the pixels.

2. The semiconductor device according to claim 1, wherein the plurality of pixels and the plurality of sensor circuits are provided on a substrate.

3. The semiconductor device according to claim 1,
wherein the amplifier circuit comprises a second transistor and a third transistor,
wherein one of a source and drain of the second transistor is electrically connected to a gate of the first transistor, and
wherein each of the plurality of light-receiving elements is electrically connected to the gate of the second transistor via the first transistor.

4. The semiconductor device according to claim 1,
wherein each of the plurality of pixels comprises a reflective liquid crystal element.

5. The semiconductor device according to claim 1,
wherein each of the plurality of pixels comprises a transmissive liquid crystal element.

6. The semiconductor device according to claim 1,
wherein each of the plurality of light-receiving elements comprises an i-type amorphous silicon layer and a pair of electrodes in contact with the i-type amorphous silicon layer.

7. A semiconductor device comprising:
a plurality of pixels; and
a plurality of sensor circuits,
wherein each of the plurality of sensor circuits comprises an amplifier circuit and a plurality of light-receiving elements,
wherein each of the plurality of light-receiving elements is electrically connected to the amplifier circuit via a first transistor provided for each of the light receiving elements,
wherein the first transistor includes an oxide semiconductor layer,
wherein the number of the sensor circuits is less than the number of the pixels.

8. The semiconductor device according to claim 7,
wherein the plurality of pixels and the plurality of sensor circuits are provided on a substrate.

9. The semiconductor device according to claim 7,
wherein the amplifier circuit comprises a second transistor and a third transistor,
wherein one of a source and drain of the second transistor is electrically connected to a gate of the first transistor, and
wherein each of the plurality of light-receiving elements is electrically connected to the gate of the second transistor via the first transistor.

10. The semiconductor device according to claim 7,
wherein each of the plurality of pixels comprises a reflective liquid crystal element.

11. The semiconductor device according to claim 7,
wherein each of the plurality of pixels comprises a transmissive liquid crystal element.

12. The semiconductor device according to claim 7,
wherein each of the plurality of light-receiving elements comprises an i-type amorphous silicon layer and a pair of electrodes in contact with the i-type amorphous silicon layer.

13. The semiconductor device according to claim 7,
wherein the oxide semiconductor layer comprises indium and zinc.

14. A semiconductor device comprising:
a plurality of pixels; and
a plurality of sensor circuits,
wherein each of the plurality of sensor circuits comprises an amplifier circuit and a plurality of light-receiving elements,
wherein each of the plurality of light-receiving elements is electrically connected to the amplifier circuit via a first transistor provided for each of the light receiving elements, and
wherein the one sensor circuit is provided for 4 to 20 pixels inclusive.

15. The semiconductor device according to claim 14,
wherein the plurality of pixels and the plurality of sensor circuits are provided on a substrate.

16. The semiconductor device according to claim 14,
wherein the amplifier circuit comprises a second transistor and a third transistor,
wherein one of a source and drain of the second transistor is electrically connected to a gate of the first transistor, and
wherein each of the plurality of light-receiving elements is electrically connected to the gate of the second transistor via the first transistor.

17. The semiconductor device according to claim 14,
wherein each of the plurality of pixels comprises a reflective liquid crystal element.

18. The semiconductor device according to claim 14,
wherein each of the plurality of pixels comprises a transmissive liquid crystal element.

19. The semiconductor device according to claim 14,
wherein each of the plurality of light-receiving elements comprises an i-type amorphous silicon layer and a pair of electrodes in contact with the i-type amorphous silicon layer.

* * * * *